US010666275B1

(12) United States Patent
Tiemann

(10) Patent No.: US 10,666,275 B1
(45) Date of Patent: May 26, 2020

(54) MICRO-COMB TERAHERTZ RADIUM ION CLOCK (MCTRICK)

(71) Applicant: LOCKHEED MARTIN CORPORATION, Bethesda, MD (US)

(72) Inventor: Bruce G. Tiemann, Longmont, CO (US)

(73) Assignee: LOCKHEED MARTIN CORPORATION, Bethesda, MD (US)

(*) Notice: Subject to any disclaimer, the term of this patent is extended or adjusted under 35 U.S.C. 154(b) by 0 days.

(21) Appl. No.: 16/232,909

(22) Filed: Dec. 26, 2018

(51) Int. Cl.
H03L 7/26 (2006.01)
H03B 17/00 (2006.01)
G04F 5/14 (2006.01)

(52) U.S. Cl.
CPC .............. H03L 7/26 (2013.01); G04F 5/14 (2013.01); H03B 17/00 (2013.01)

(58) Field of Classification Search
CPC ........... G04F 5/14; G04F 5/145; H03B 17/00; H03L 7/26
USPC ..................................................... 331/3, 94.1
See application file for complete search history.

(56) References Cited

U.S. PATENT DOCUMENTS 5,338,930 A * 8/1994 Chu .......................... G04F 5/14
250/251
6,489,609 B1 * 12/2002 Baba ................... G01N 21/6404
250/281
7,859,350 B1 * 12/2010 Schwindt ................ H03L 7/099
331/3
7,982,944 B2 * 7/2011 Kippenberg .............. G02F 1/39
359/245
10,340,658 B1 * 7/2019 Boyd ..................... H01S 5/0687
10,342,113 B2 * 7/2019 Kock ........................ H05H 3/02
2009/0284828 A1 * 11/2009 Sosabowski .......... H01S 3/1115
359/326
2017/0176949 A1 * 6/2017 Liang .................... G02F 1/0356
2019/0287782 A1 * 9/2019 Vrijsen ................. H01J 49/161

OTHER PUBLICATIONS

Versolato et al., "Radium Single-Ion Optical Clock." https://www.researchgate.net/publication/49943249_Radium_single-ion_optical_clock. Feb. 2011.*

* cited by examiner

Primary Examiner — Levi Gannon
(74) Attorney, Agent, or Firm — Morgan, Lewis & Bockius LLP

(57) ABSTRACT

An ion-based atomic clock includes an ion trap, a cooling laser, a re-pumping source and a frequency comb source. The ion trap can trap a plurality of Ra$^+$ ions generated by an ion generator. The cooling laser can facilitate trapping of the plurality of Ra$^+$ ions within the ion trap and populate excited state levels in the trapped Ra$^+$ ions. The re-pumping source can trigger decaying of the excited state levels to a first metastable level. The frequency comb source can directly drive a multi-terahertz (multi-THz) clock transition between the first metastable level and a second metastable level in the trapped Ra$^+$ ions. A signal derived from the population remaining in the first metastable level following the driving of the clock transition can be used to guide the repetition rate of the frequency comb source to an accurate frequency related to the clock transition frequency.

20 Claims, 4 Drawing Sheets

MICRO-COMB TERAHERTZ RADIUM ION CLOCK (MCTRICK)

STATEMENT REGARDING FEDERALLY SPONSORED RESEARCH OR DEVELOPMENT

Not applicable

FIELD OF THE INVENTION

The present invention generally relates to atomic clocks, and more particularly, to a micro-comb terahertz radium ion clock (MCTRICk).

BACKGROUND

Atomic clocks are considered the most accurate time and frequency standards known to date, and are used as primary standards for international time distribution services, for example, in applications such as communications, finance, navigation and location determination systems. An atomic clock may use an electron transition as a frequency standard for its timekeeping element. The frequency standard can be, for example, a frequency in the microwave, optical, or ultraviolet region of the electromagnetic spectrum that, for example, electrons in atoms may emit when they change energy levels. Early atomic clocks were based on masers at room temperature. Currently, the most accurate atomic clocks first cool the atoms to near absolute zero temperature by slowing them with lasers and probing them in atomic fountains in a microwave-filled cavity.

Precision timing may be essential for inertial navigation systems operating in the absence of GPS, as well as for GPS receivers operating in areas with noisy or intermittent GPS readings. Generating timing locally on a receiving platform may reduce or eliminate the reliance on GPS signals for timing. While clocks have been used to generate timing locally, it is understood that previous clocks have been either far too large, heavy, and/or power-hungry to use on a receiving platform or far too inaccurate or unstable to be usable for many demanding applications. Generating timing locally on a receiving platform may reduce or eliminate the reliance on GPS signals for timing.

Low size, weight, and power (SWaP) microwave neutral atom clocks based on small vapor cells have been developed and are called chip scale atomic clocks (CSAC). CSAC devices, such as compact cesium (Cs) and Rubidium (Rb) clocks, have instability (at 1 sec integration duration) of $3.5 \times 10^{-10}$, long term aging of $9 \times 10^{-10}$/month, and maximum frequency change of $5 \times 10^{-10}$ over an operating temperature range of $-10°$ C. to $+35°$ C. CSAC devices may have inaccuracy of $10^{-10}$. While low SWaP, the stability and accuracy of CSAC devices may be $10^{-4}$ that of some embodiments herein and $1 \times 10^{-8}$ that of laboratory-grade optical clocks. Moreover, CSAC devices may rely on vapor cells that are very sensitive to environmental temperature and may display aging. CSAC devices may also require extensive (e.g., 6-12 hours) calibration after turn-on and may be limited to mission durations of 3-6 hours due to temperature sensitivity and aging. On the other hand, higher precision Cs and Rb clocks such as those commercially available may provide improved accuracy and stability (e.g., $5 \times 10^{-13}$ inaccuracy and $5 \times 10^{-12}$ instability), but at the cost of significantly higher SWaP (e.g., these devices may have a volume of approximately 10 liters, while CSAC devices may have a volume of approximately 20 cubic centimeters).

SUMMARY

According to various aspects of the subject technology, methods and configuration are disclosed for providing a micro-comb terahertz ion clock based on radium (Ra) ion transitions. The subject technology uses Raman transition between long-lived states of the Ra ion that can be highly advantageous from a low size, weight, and power (SWaP) perspective. This is because the clock frequency is a Raman transition rather than a direct optical transition, thus there is no need for a high-SWAP, octave-spanning self-referenced comb to serve as the gearing to bring the high clock frequency down to a useable radio frequency (RF); instead, merely the repetition rate of the comb has to be stabilized, which may already be in a convenient RF range.

In one or more aspects, an ion-based atomic clock includes an ion trap, a cooling laser, a re-pumping source and a frequency comb source. The ion trap can trap a plurality of $Ra^+$ ions generated by an ion generator. The cooling laser can facilitate trapping of the plurality of Ra+ ions within the ion trap and populate excited state levels in the trapped $Ra^+$ ions. The re-pumping source can trigger decaying of the excited state levels to a first metastable level. The frequency comb source can directly drive a multi-terahertz (multi-THz) transition between the first metastable level and a second metastable level in the trapped $Ra^+$ ions.

In yet other aspects, an apparatus includes an ion trap to trap a plurality of $Ra^+$ ions; and a micro-resonator-based frequency comb to directly drive a multi-THz transition between a first metastable level and a second metastable level in the trapped plurality of $Ra^+$ ions.

In yet other aspects, a method includes trapping a plurality of $Ra^+$ ions in an ion trap. The method further includes directly driving a multi-terahertz transition between a first metastable level and a second metastable level in the trapped plurality of Ra+ ions using a micro-resonator-based frequency comb.

The foregoing has outlined rather broadly the features of the present disclosure so that the following detailed description can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

Figure 1:
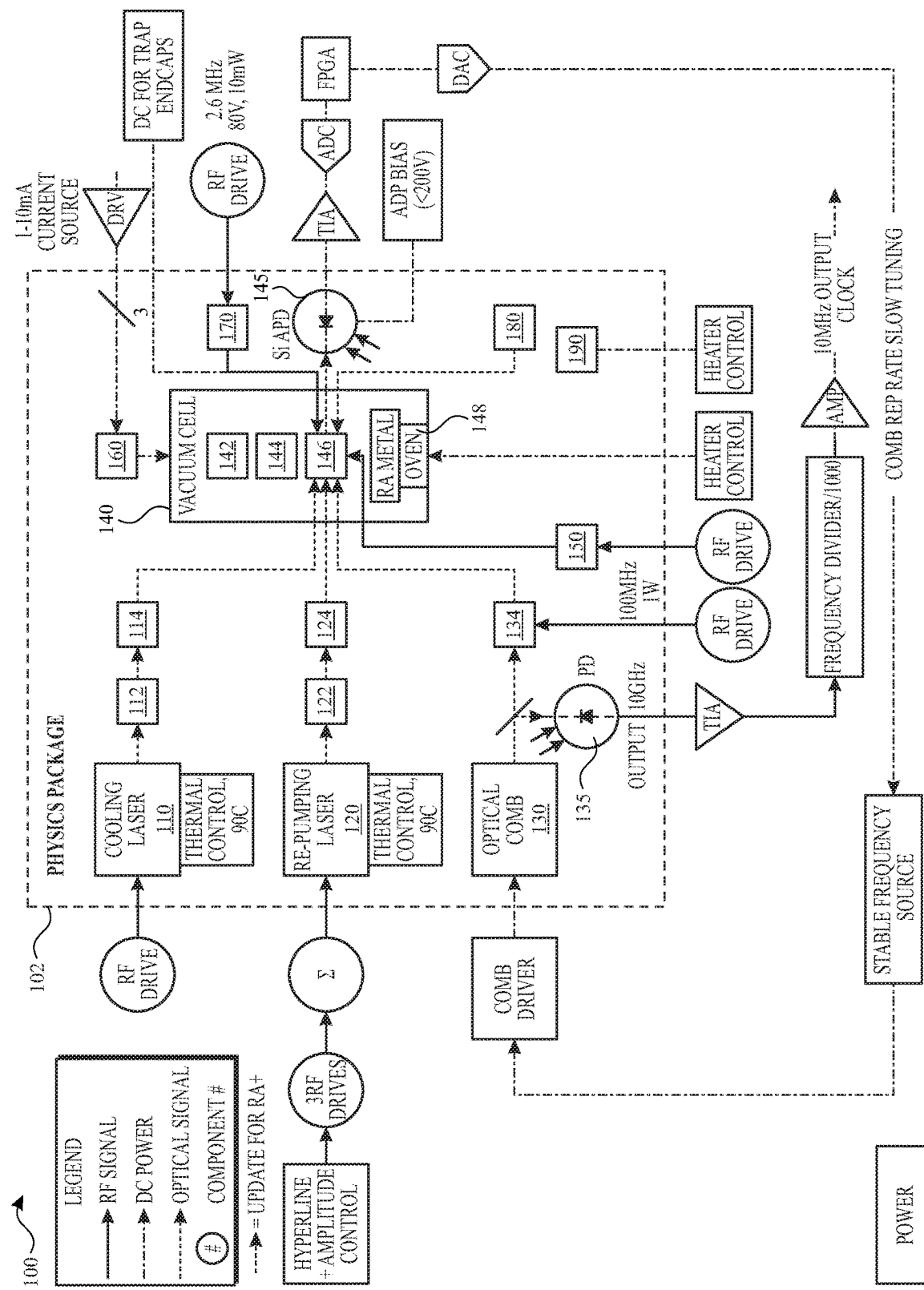
FIG. 1 is a schematic diagram illustrating an example of an atomic clock apparatus, according to certain aspects of the disclosure.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In some aspects of the present technology, methods and configurations are described for providing a micro-comb terahertz (THz) ion clock based on radium (Ra) ion transitions. The subject technology is an improvement over a micro-comb THz ion clock based on Raman transition between long-lived d states in alkaline earth metal ions such as calcium ion ($Ca^+$), strontium ion ($Sr^+$) and barium ion ($Ba^+$). The subject technology does not need to rely on ultimate stabilization of the clock laser frequency because the effect of detuning the comb wavelength only amounts to minor effects, such as a very slow change in Rabi rates, rather than causing a direct first-order impact on clock frequency. The three ions mentioned, $Ca^+$, $Sr^+$ and $Ba^+$, have increasing clock frequencies in order, 1.8, 8.4 and 24 THz, respectively. It is understood that clock stability and accuracy typically improves with clock frequency.

The Ra ion used in the subject technology has a similar energy level structure as the other alkaline earth metal ions mentioned above. Although all Ra isotopes are radioactive, the minute amount used for the clock that only requires the trapping of tens to hundreds of ions would amount to a substantially insignificant radioactivity. Thanks to the disparate Ra half-lives, Ra 226 isotope, which has a much longer half-life than any other isotope, would effectively self-enrich, outlasting any other isotope and tending to make the sample nearly 100% isotopically pure. Further, Ra 226 isotope has a nuclear spin of zero that simplifies the hyperfine structure. The clock frequency associated with $Ra^+$ is about 49.7 THz, which is slightly over twice that of the 24 THz of Ba. This can lead to a more stable and accurate clock given the known relation of clock frequency to exhibited stability.

Additionally, the ancillary optical wavelengths needed to exhibit the clock, for example, about 468 nm for cooling and about 1079 nm for re-pumping are relatively convenient. Atoms in the upper D state can be coupled to the P state using 802.2 nm light. The Raman transition could be near resonant with either 1079 nm or 708 nm, for example, including near 1064 nm or other convenient wavelengths.

The Ra ion used in the disclosed solution has advantages over other alkaline earth metal ions such as $Ca^+$, $Sr^+$ and $Ba^+$, for example, with respect to the clock frequency. As mentioned above, the clock stability and accuracy tends to improve with clock frequency. This is why the metrology labs, for example, are increasingly turning to optical frequency standards (e.g., operating at clock frequencies of $~10^{14}$ Hz or even $10^{15}$ Hz), which have already been demonstrated to be much better than the present primary time standard, Cs, which operates at a clock frequency of $~10^{10}$ Hz. Although the micro-comb THz Ra ion clock (MCTRICK) of the subject technology operates at lower frequency than the present front-runners in the optical domain (at $5 \times 10^{13}$ Hz), advantageously, it does not need a large, power-hungry octave-spanning self-referenced comb laser for clock readout, and therefore allows a highly miniaturized physics package.

FIG. 1 is a schematic diagram illustrating an example of an atomic clock apparatus 100, according to certain aspects of the disclosure. Atomic clock apparatus 100 includes a main unit 102 enclosed in a small physics package (e.g., the size of a smartphone) and a number of auxiliary components that support operation of the main unit 102. The main unit 102 includes a cooling laser 110, a re-pumping laser source 120, an optical comb 130, a vacuum cell 140, an antenna 150, Helmholtz coils 160, helical resonator 170, a reset light-emitting diode (LED) 180 and a physics package heater 190. The vacuum cell 140 is a mini-vacuum ion trap assembly and includes a mini-vacuum pump (e.g., an ion pump) 142, an electron impact ionizer 144, an ion trap 146 and an oven 148 that includes a Ra metal source. Vacuum pump 142 maintains the vacuum cell at a suitable low pressure. The oven 148 can heat up the Ra metal to a suitable temperature (e.g., 50° C. to 100° C.) to evaporate enough atoms that can be trapped in ion trap 146 and be ionized by ionizer 144 to produce $Ra^+$ ions, as discussed herein. Ionizer 144 may be an electron impact ionizer driven by electrical feedthroughs. In an alternative embodiment, ionizer 144 may be and may be ionized by ionizer 144 to produce Ra+ ions, as discussed herein. Ionizer 144 may be an electron impact ionizer, driven by electrical feedthroughs. In an alternative embodiment, 144 may be a photoionizer that generates ions by illumination of the Ra atoms with an appropriate wavelength of light. Ion trap 146 is fed by a suitable DC voltage and RF signals produced by helical resonator 170 and antenna 150. The helical resonator 170 and the antenna 150 are driven by respective RF drive circuits. Physics package heater 190 is controlled by a heater control circuit and is used to adjust and stabilize the temperature of the physics package of atomic clock apparatus 100.

Cooling laser 110 may receive an RF drive signal and provides a cooling laser beam that passes through an isolator 112 and a shutter 114 to ion trap 146. Isolator 112 can isolate cooling laser 110 from stray reflections and prevent them from entering cooling laser 110. Shutter 114 can be an acousto-optic modulator (AOM), also referred to as a Bragg cell, that can use the acousto-optic effect to diffract the laser light, and is used to shut the laser beam off as needed. The cooling laser beam of cooling laser 110 can slow down (i.e., cool) the Ra+ ions in the ion trap 145 to facilitate trapping of the $Ra^+$ ions in the ion trap 146. The cooling beam may be tuned to be slightly red-shifted off of the transition center so that upon absorption by the $Ra^+$ ions, the photons may have a momentum in an opposite direction of the momentum of the $Ra^+$ ion and is Doppler shifted, which result may be subtracting from the kinetic energy of the $Ra^+$ ions by transferring a momentum to the ion that is opposite in sign to its original momentum, thus slowing down the ion. In order to cool down the Ra+ ions in all directions (e.g., X, Y and Z) using only one cooling beam, the cooling beam enters ion trap 146 in a diagonal direction such that it can produce momentum components in all principal directions of the trap coordinate frame.

Re-pumping laser source 120 is a laser source that may receive an RF drive signal and provides a re-pumping laser beam that passes through an isolator 122 and a shutter 124 (e.g., an AOM) to ion trap 146. Isolator 122 and shutter 124 are similar to isolator 112 and 114 described above and are used to perform similar functions. The re-pumping laser beam can bring the $Ra^+$ ions into a right (i.e., correct) quantum state, if they are moved to a wrong quantum state, and prepare them for the Raman transition that is the basis of atomic clock operation.

Optical comb source 130 is a micro-resonator-based frequency comb laser source that is driven by a comb driver and can generate a laser light with a spectrum that includes a series of discrete and equally spaced frequency lines (e.g., >50,000 lines with 1 GHz spacing), the frequency spacing of which can be accurately stabilized. The frequency lines of optical comb source 130 can provide an accurate 50 THz frequency needed to drive the Raman transition in Ra$^+$ ions in ion trap 146 that are in the correct quantum state for transition, after re-pumping by the re-pump beam, and thus drive the atomic clock. In some implementations, optical comb source 130 may provide an output clock pulse similar to a pulsed laser. In one or more implementations, a polarization of the optical comb source 130 may be tuned to make the atomic clock apparatus 100 insensitive to laser light power fluctuations.

The laser light from optical comb passes through a shutter 134, which is similar to shutter 114 described above, before entering ion trap 146. Shutter 134 allows controlling (shutting off or on) the optical comb laser beam as needed, because the cooling beam of cooling laser 110, the re-pumping laser beam of re-pumping laser source 120 and the optical comb laser beam of optical comb source 130 are to be applied to the Ra$^+$ ions in ion trap 146 in sequence and not necessarily simultaneously. A reset LED 180 can be used to return ions back to the ground state for subsequent clock measurements.

The optical comb frequency lines are stabilized by using a feedback derived from a light output of the ion trap which is detected, for example, by a photon-counting detector such as a silicon avalanche photodiode (APD) 145. The RF current signals from the APD are transformed into voltage signals using a trans-impedance amplifier (TIA) and are converted to digital signals by an analog-to-digital converter (ADC) for processing by a field-programmable gate array (FPGA). The output of the FPGA is back converted to analog signals via a digital-to-analog converter (DAC) and used to provide feedback to a stable frequency by a stable frequency source that feeds the comb driver.

The clock output is derived from the repetition rate of the stabilized optical comb beam, for example, at 10 GHz, and using a photodiode (PD135 and a TIA, converted to RF voltage signals that are processed by a frequency divider (e.g., 1/1000 divider) and amplified by an amplifier (AMP) to generate a stable 10 MHz output clock. It is noted that atomic clock apparatus 100 does not depend on a carrier-offset-stabilized frequency comb.

Figure 2:
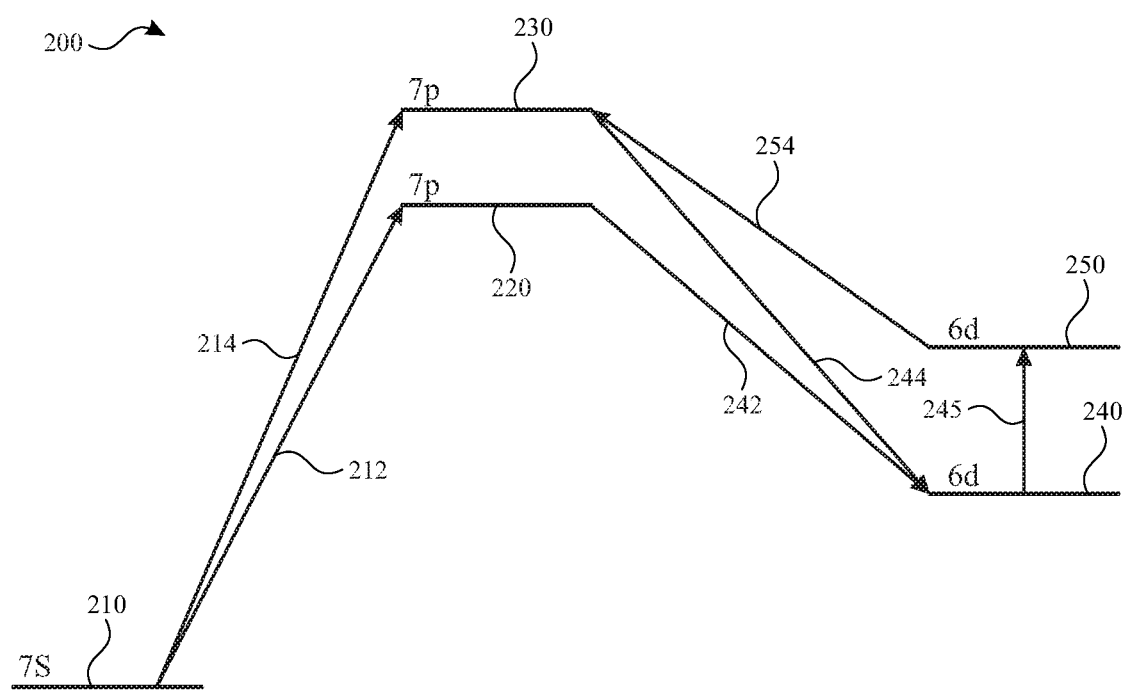
FIG. 2 is a schematic diagram showing radium (Ra) energy level and relevant transitions.

FIG. 2 is a schematic diagram showing Ra energy level 200 and relevant transitions. The atomic clock of the subject technology, as discussed above, operates based on Raman transitions of Ra$^+$ ions. The Ra$^+$ ion energy levels as shown in FIG. 2 include a ground state 210, excited states 220 and 230 and clock states 240 and 250. Ground state 210 is a 7s state and excited states 220 and 230 are in 7p states. The energy of the excited states 220 and 230 are approximately 21,351.3 cm$^{-1}$ and 26,208.9 cm$^{-1}$, respectively, when expressed in wavenumbers. One wave number corresponds to the energy of a photon having a wavelength of one centimeter, which translates to about 30 GHz of frequency. Atoms in excited state 220 result from interaction of the cooling beam (generated by cooling laser 110 of FIG. 1) with the Ra$^+$ ions in their ground state 210. In other words, transition 212 from ground state 210 to excited state 220 is made possible by energy transfer from the cooling laser beam. The wavelengths of transitions 212 and 214 are about 468.4 nm and 381.6 nm, respectively.

The Ra+ ions in excited state 220 make transition 242 by radiatively decaying to clock state level 240, which is a metastable state (a 6d state), also referred to as the first metastable level. Atoms that fall into an undesired sub-state of state 240 may be repumped back into state 220 as a result of re-pumping by the re-pumping laser beam, and may decay into a correct sub-state. Alternatively, excited state 220 can radiatively decay to ground state 210, but may be returned to state 220 for another chance to fall into the correct sub sate of state 240 by continued application of the cooling beam. Ideally, a number of atoms are converted into the correct sub-state 240 for clock operation. Clock states 240 and 250 are at energy levels of about 12084.3 cm$^{-1}$ and 13743.0 cm$^{-1}$ and are both 6d states. The wavelengths associated with transitions 242 and 244 are about 1079.1 nm and 708 nm, respectively. It is noted that both clock states 240 and 250 are forbidden from decaying to the ground state due spin-related transition rules. Accordingly, the re-pumping of Ra$^+$ ions populates clock state 240 that has a long life time and in which the population of Ra+ ions can be substantially high.

The Raman transition 245, with an energy of about 1658.7 cm$^{-1}$ corresponding to a frequency of about 49.726 or approximately 50 THz, however, can take place from clock state 240 (first metastable level) to clock state 250, also referred to as the second metastable level. Raman transition 245 is made possible by the presence of comb teeth with a 50 THz frequency spacing (equivalent in energy to photons having a wavelength of about 6.029 μm) in the laser beam of comb laser 130, which may partially populate clock state 250. In other words, in the ion trap 146 of FIG. 1, Raman transition 245 can place Ra$^+$ ions in a superposition of clock states 240 and 250, allow them to evolve for a period of time and then project them back into ideally a 50% population superposition. The composition of the final superposition may depend precisely on the detuning between the difference frequency between the comb teeth 50 THz apart and the actual clock transition frequency. When subsequently illuminated with cooling and pumping beams, the light output of the ion trap 146 of FIG. 1 is then an indicator of a deviation in population of the first metastable level and the second metastable level from a balanced ratio (e.g., a 50% population ratio). In other words, the light output of the ion trap 146 of FIG. 1 is an indicator of a deviation of the frequency of the optical comb source 130 from 50 THz, and the knowledge of this deviation allows the comb repetition rate, and hence the frequency difference between the comb lines 50 THz apart, to be adjusted towards the actual clock transition frequency.

In other words, when the 50% population ratio is maintained, the clock frequency is highly accurate and as a result the comb laser beam frequency and the output frequency of the atomic clock apparatus 100 of FIG. 1 are highly accurate.

Figure 3:
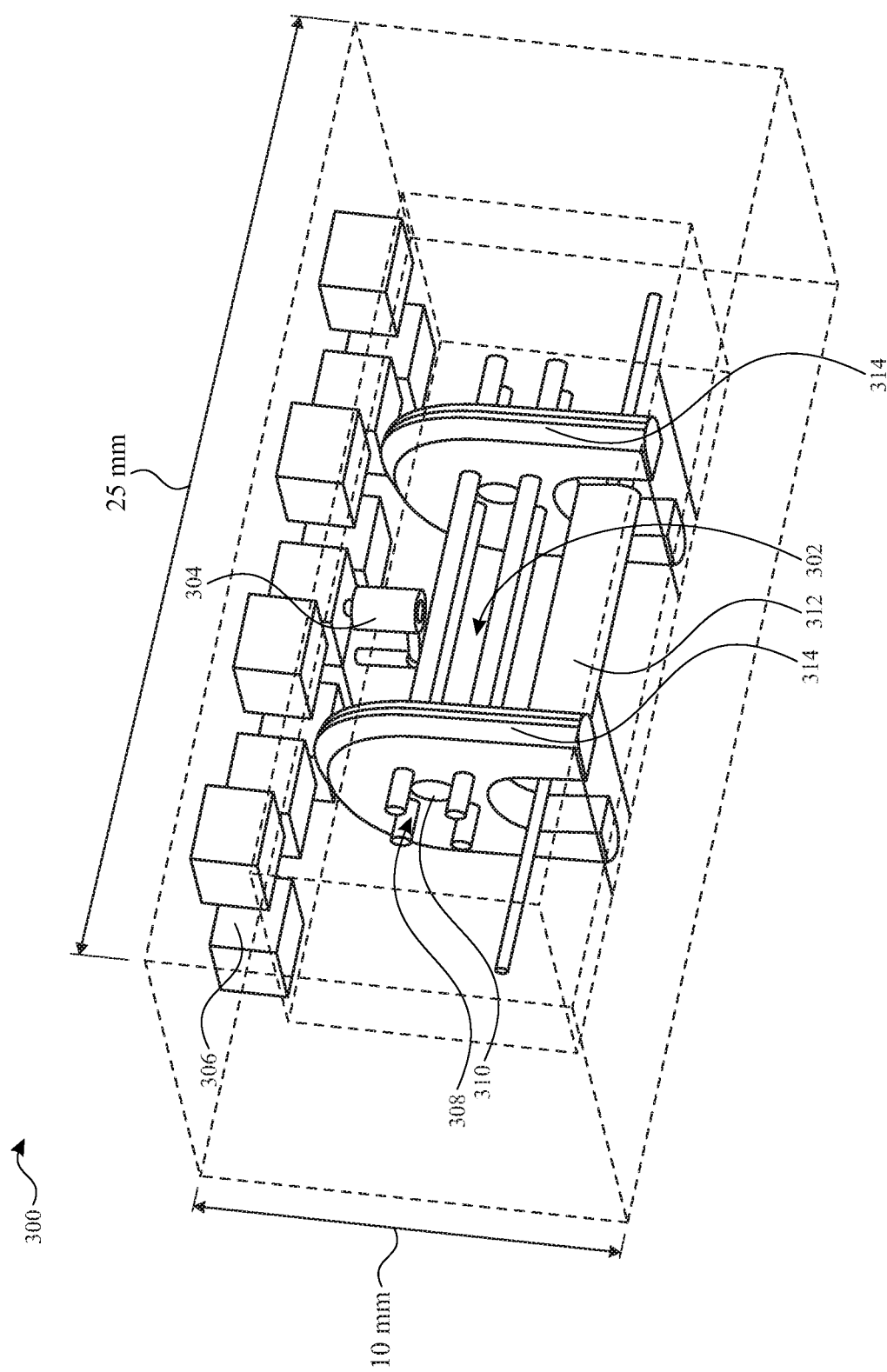
FIG. 3 is a perspective view of an exemplary ion trap, according to certain aspects of the disclosure.

FIG. 3 is a perspective view of an exemplary ion trap 300, according to certain aspects of the disclosure. Ion trap 300 is an example implementation of the ion trap 146 of FIG. 1. As shown in FIG. 3, according to some embodiments, ion trap 300 may be approximately 25 millimeters by 10 millimeters. In some implementations, ion trap 300 may include ion trap region 302, in which ions may be located while trapped. Additionally, ion trap 300 may include a Ra oven 304 or any other suitable oven, which may be disposed above ion trap region 302. Ion trap 300 may also include electrical feedthroughs 306, which can be disposed above Ra oven 304 and may include 12 or any other suitable number of feedthroughs.

According to some embodiments, ion trap 300 may include one or more insulating rod feedthrough(s) 308, including four or any other number of feedthroughs. Additionally, ion trap 300 may include a laser beam aperture 310, which can be in between the insulating rod feedthrough(s) 308 and may intersect ion trap region 302. In some embodiments, ion trap 300 may include getter material 312, which may be disposed below ion trap region 302. Additionally, ion trap 300 may include metalized trap endcap and mount 314, which can be disposed on both ends of insulating rod feedthrough(s) 308.

Figure 4:
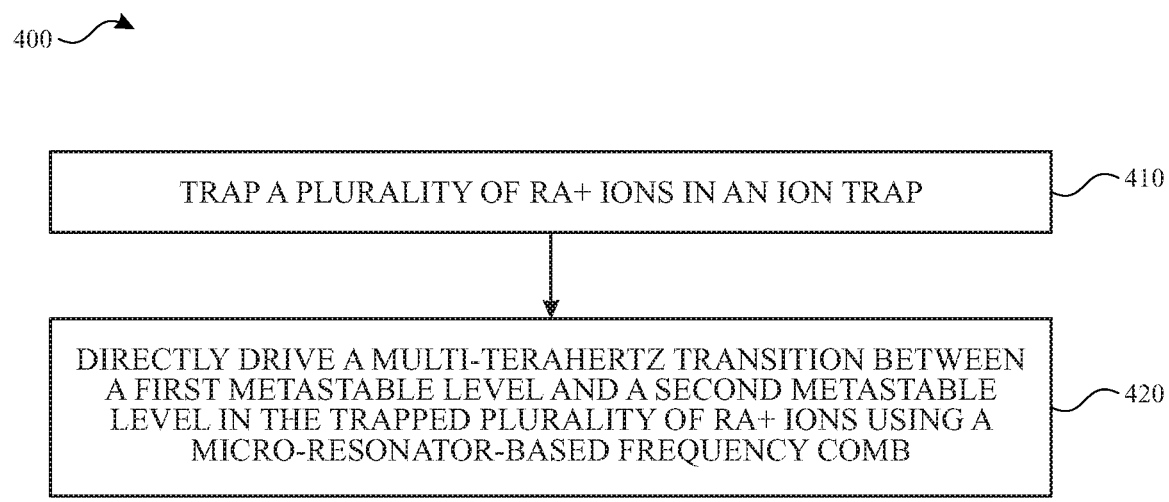
FIG. 4 is a flow diagram of a method of operation of an exemplary atomic clock apparatus, according to certain aspects of the disclosure.

FIG. 4 is a flow diagram of a method 400 of operation of an exemplary atomic clock apparatus, according to certain aspects of the disclosure. The method 400 includes trapping a plurality of $Ra^+$ ions in an ion trap (e.g., 146 of FIG. 1) (410). The method further includes directly driving a multi-THz transition between a first metastable level (e.g., 240 of FIG. 2) and a second metastable level (e.g., 250 of FIG. 2) in the trapped plurality of $Ra^+$ ions using a micro-resonator-based frequency comb (e.g., 130 of FIG. 1) (420).

In some aspects, the subject technology is related to atomic clocks, and more particularly, to a micro-comb THz Ra ion clock. In some aspects, the subject technology may be used in various markets, including, for example and without limitation, next-generation electronics, signal processing and communications and control systems markets.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the embodiments described above should not be understood as requiring such separation in all embodiments, and it should be understood that the described program components and systems can generally be integrated together in a single hardware and software product or packaged into multiple hardware and software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An ion-based atomic clock comprising:
   an ion trap configured to trap a plurality of $Ra^+$ ions generated by an ion generator;
   a cooling laser configured to facilitate trapping of the plurality of $Ra^+$ ions within the ion trap and populate excited state levels in the trapped plurality of $Ra^+$ ions;
   a re-pumping source configured to trigger decaying of the excited state levels to a first metastable level; and
   a frequency comb source configured to directly drive a multi-terahertz (THz) transition between the first metastable level and a second metastable level in the trapped plurality of $Ra^+$ ions.

2. The ion-based atomic clock of claim 1, wherein the frequency comb source comprises a micro-resonator-based frequency comb configured to directly drive a 50 THz Raman transition in at least one Ra$^+$ ion, wherein the 50 THz Raman transition is between the first metastable level and the second metastable level.

3. The ion-based atomic clock of claim 2, wherein a frequency of the micro-resonator-based frequency comb is stabilized by employing a feedback loop based on a signal derived from a light output of the ion trap.

4. The ion-based atomic clock of claim 3, wherein the light output is configured to indicate a deviation in population of the first metastable level and the second metastable level from a balanced population ratio, wherein the balanced population ratio is a 50 percent ratio.

5. The ion-based atomic clock of claim 4, wherein the light output is configured to indicate a deviation of a frequency of the frequency comb source from 50 THz.

6. The ion-based atomic clock of claim 1, wherein the frequency comb source is configured to provide an output clock pulse similar to a pulsed laser.

7. The ion-based atomic clock of claim 1, wherein the ion-based atomic clock is free of a carrier-offset-stabilized frequency comb.

8. The ion-based atomic clock of claim 1, further comprising a mini-vacuum ion trap assembly.

9. The ion-based atomic clock of claim 1, wherein polarization of the frequency comb source is tuned to make the ion-based atomic clock insensitive to laser light power fluctuations.

10. The ion-based atomic clock of claim 1, wherein the first metastable level comprises a 6d-state in the trapped plurality of Ra$^+$ ions at an about 12,084.3 cm$^{-1}$ energy level.

11. The ion-based atomic clock of claim 1, wherein the second metastable level comprises a 6d-state in the trapped plurality of Ra$^+$ ions at an about 13,743.0 cm$^{-1}$ energy level.

12. An apparatus comprising:
an ion trap configured to trap a plurality of Ra$^+$ ions; and
a micro-resonator-based frequency comb configured to directly drive a multi-terahertz (multi-THz)
transition between a first metastable level and a second metastable level in the trapped plurality of Ra$^+$ ions.

13. The apparatus of claim 12, wherein the micro-resonator-based frequency comb is configured to directly drive a 50 THz transition in at least one Ra$^+$ ion of the trapped plurality of Ra$^+$ ions.

14. The apparatus of claim 12, wherein a frequency of the micro-resonator-based frequency comb is stabilized by employing a feedback loop based on a signal derived from a light output of the ion trap.

15. The apparatus of claim 14, wherein the light output is configured to indicate a deviation of a frequency of the micro-resonator-based frequency comb from 50 THz.

16. The apparatus of claim 12, wherein the first metastable level comprises a 6d-state in the trapped Ra$^+$ ion at about 12,084.3 cm$^{-1}$ energy level, and wherein the second metastable level comprises a 6d-state in the trapped Ra$^+$ ion at about 13,743.0 cm$^{-1}$ energy level.

17. A method comprising:
trapping a plurality of Ra$^+$ ions in an ion trap; and
directly driving a multi-terahertz (Multi-THz) transition between a first metastable level and a second metastable level in the trapped plurality of Ra$^+$ ions using a micro-resonator-based frequency comb.

18. The method of claim 17, wherein:
directly driving the multi-THz transition comprises directly driving a 50 THz transition in at least one Ra$^+$ ion of the trapped plurality of Ra$^+$ ions,
the first metastable level comprises a 6d-state in the trapped Ra+ ion at about 12,084.3 cm$^{-1}$ energy level, and
the second metastable level comprises a 6d-state in the trapped Ra+ ion at about 13,743.0 cm$^{-1}$ energy level.

19. The method of claim 17, further comprising stabilizing a frequency of the micro-resonator-based frequency comb by employing a feedback loop based on an RF signal derived from a light output of the ion trap.

20. The method of claim 19, wherein the light output is configured to indicate a deviation of a frequency of the micro-resonator-based frequency comb from 50 THz.

* * * * *